US008618534B2

(12) United States Patent
Guo et al.

(10) Patent No.: US 8,618,534 B2
(45) Date of Patent: Dec. 31, 2013

(54) FIELD-EFFECT TRANSISTOR WITH A DIELECTRIC LAYER HAVING THEREIN DENATURED ALBUMEN

(75) Inventors: Tzung-Fang Guo, Tainan (TW); Jer-Wei Chang, Tainan (TW); Ten-Chin Wen, Tainan (TW)

(73) Assignee: National Cheng Kung University, Tainan (TW)

( * ) Notice: Subject to any disclaimer, the term of this patent is extended or adjusted under 35 U.S.C. 154(b) by 0 days.

(21) Appl. No.: 13/367,892

(22) Filed: Feb. 7, 2012

(65) Prior Publication Data

US 2013/0112967 A1 May 9, 2013

(30) Foreign Application Priority Data

Nov. 9, 2011 (TW) .............................. 100140850 A

(51) Int. Cl.
*H01L 29/08* (2006.01)

(52) U.S. Cl.
USPC .................. 257/40; 257/20; 257/27; 257/192; 257/213; 257/E51.005; 438/135; 438/287; 438/623

(58) Field of Classification Search
USPC ............... 257/20, 40, 27, 192, 213, 642, 759, 257/E51.005–E51.01; 438/135, 287, 623
See application file for complete search history.

(56) References Cited

U.S. PATENT DOCUMENTS

2010/0140596 A1* 6/2010 Noh et al. ...................... 257/40

OTHER PUBLICATIONS

Jer-wei Chang, Cheng-Guang Wang, Chong-Yu Huang, Tzung-Da Tsai, Tzung-Fang Guo, and Ten-Chin Wen, "Chicken Albumen Dielectric in Organic Field Effect Transistors", Advanced Materials, Aug. 2, 2011, 23, pp. 4077-4081.*
W. Guo, S. Trabelsi, S.O Nelson, and D.R. Jones, Storage effects on dielectric properties of Eggs from 10-1800MzH, Food Engineering and Physical Properties, 2007, vol. 72, E335-E340.*
Birendra Singh, et al., "Bio-organic-semiconductor-field-effect-transistor Based on Deoxyribonucleic Acid Gate Dielectric", Published online on Jul. 28, 2006, Journal of Applied Physics 100, 024514 (2006), http://dx.doi.org/10.1063/1.2220488.
C. Yumusak, et al., "Bio-organic Filed Effect Transistors Based on Crosslinked Deoxyribonucleic Acid (DNA) Gate Dielectric", Published online on Dec. 29, 2009, Applied Physics Letters 95, 263304 (2009), http://dx.doi.org/10.1063/1.3278592.
Christopher J. Bettinger, et al., "Organic Thin-Film Transistors Fabricated on Resorbable Biomaterial Substrates", Published online on Nov. 4, 2009, DOI: 10.1002/adma.200902322, 2010 Wiley_VCH Verlag GmbH & Co. KGaA, Winheim, Adv. Mater. 2010, 22, pp. 651-655.
Chung-Hwa Wang, et al., "Flexible Organic Thin-Film Transistors with Silk Fibroin as the Gate Dielectric", Published Online on Mar. 1, 2011, DOI: 10.1002/adma.201004071, 2011 Wiley-VCH Verlag GmbH & Co. KGaA, Weinheim, Adv. Mater. 2011, 23, pp. 1630-1634.
Dae-Hyeong Kim, et al., "Dissolvable Films of Silk Fibroin for Ultrathin Conformal Bio-Integrated Electronics", Nature Materials, Published Online on Apr. 18, 2010, DOI: 10.1038/NMAT2745, Macmillan Publishers Limited.

(Continued)

*Primary Examiner* — Steven Loke
*Assistant Examiner* — Cuong B Nguyen
(74) *Attorney, Agent, or Firm* — Ditthavong Mori & Steiner, P.C.

(57) ABSTRACT

A field-effect transistor includes a gate electrode, a source electrode, a drain electrode, a semiconductor active layer, and a dielectric layer. The semiconductor active layer is connected to the source electrode and the drain electrode. The dielectric layer includes denatured albumen and is positioned between the gate electrode and the semiconductor active layer.

7 Claims, 10 Drawing Sheets

(56) References Cited

OTHER PUBLICATIONS

Mihai Irimia-Vladu, et al., "Environmentally Sustainable Organic Field Effect Transistors", Organic Electronics 11 (2010) pp. 1974-1990, http://www.elsevier.com/locate/orgel, Elsevier.

Robert R. Burch, et al., "Electrical Properties of Polyunsaturated Natural Products: Field Effect Mobility of Carotenoid Polyenes", Available online on Aug. 7, 2004, Synthetic Metals 146 (2004) pp. 43-46, http://www.elsevier.com/locate/synmet, Elsevier.

Youn Sun Kim, et al., "High-mobility Bio-organic Field effect Transistors with Photoreactive DNAs as Gate Insulators", Published online on Mar. 11, 2010, Applied Physics Letter 96, 103307 (2010), http://dx.doi.org/10.1063/1.3299022.

* cited by examiner

FIELD-EFFECT TRANSISTOR WITH A DIELECTRIC LAYER HAVING THEREIN DENATURED ALBUMEN

FIELD OF THE INVENTION

The invention relates to a field-effect transistor, and more particularly, to a field-effect transistor with a dielectric layer having therein denatured albumen.

BACKGROUND OF THE INVENTION

Currently, field-effect transistors are almost formed of semiconductor materials with single element, compound elements or organic compound elements. Other than those elements described above, biomaterials have been widely employed in field-effect transistors.

In one example, β-carotene has been reported as an active layer for a field-effect transistor. See *Synth. Met.* 2004, 146, 43. In another example, deoxyribonucleic acid-hexadecyltrimethylammonium chloride (DNA-CTMA) has been reported and used as a dielectric layer for a field-effect transistor. See *J. Appl. Phys.* 2006, 100, 024514, *Appl. Phys. Lett.* 2009, 95, 263304, and *Appl. Phys. Lett.* 2010, 96, 103307. In still another example, nucleobase has also been reported and used as a dielectric layer for a field-effect transistor. See *Org. Electron.* 2010, 11, 1974. In still another example, silk has been used as a dielectric layer or a substrate for a field-effect transistor. See *Adv. Mater.* 2011, 23, 1630 and *Nat. Mater* 2010, 9, 511. In still another example, poly(L-lactide-co-glycolide) (PLGA) has also been used as a substrate for a field-effect transistor. See *Adv. Mater* 2010, 22, 651.

Biomaterials are essentially biodegradable, bio-absorbable, biocompatible, environment-friendly, and no chemical synthesization required. Biomaterials are easily acquired so that process of manufacturing the field-effect transistor is simplified and the production is inexpensive. Therefore, it is desirable to exploit more biomaterials in the field-effect transistor so as to reduce cost in the production of the field-effect transistor and to exhibit electric behavior equivalent to or better than that of any prior field-effect transistor.

SUMMARY OF THE INVENTION

One object of the invention is to provide a field-effect transistor which employs denatured albumen as a dielectric layer. The denatured albumen has such a good dielectric characteristic that the field-effect transistor according to the invention performs well in electric behavior.

To achieve the foregoing and/or other object, the invention discloses a field-effect transistor comprising:
 a gate electrode;
 a source electrode;
 a drain electrode;
 a semiconductor active layer connected to the source electrode and the drain electrode; and
 a dielectric layer including denatured albumen and positioned between the gate electrode and the semiconductor active layer.

Because the dielectric layer is between the gate electrode and the semiconductor active layer, the denatured albumen of the dielectric layer provides a good dielectric characteristic for the gate electrode and the semiconductor active layer, the field-effect transistor according to the invention performs well in electric behavior.

In another aspect, because the dielectric layer includes the denatured albumen, the field-effect transistor according to the invention may be equipped with a solid substrate or a soft substrate as required. In such an arrangement, the field-effect transistor may be designed as an inflexible electric device or a flexible electric device.

DETAILED DESCRIPTION OF THE INVENTION

Figure 1:
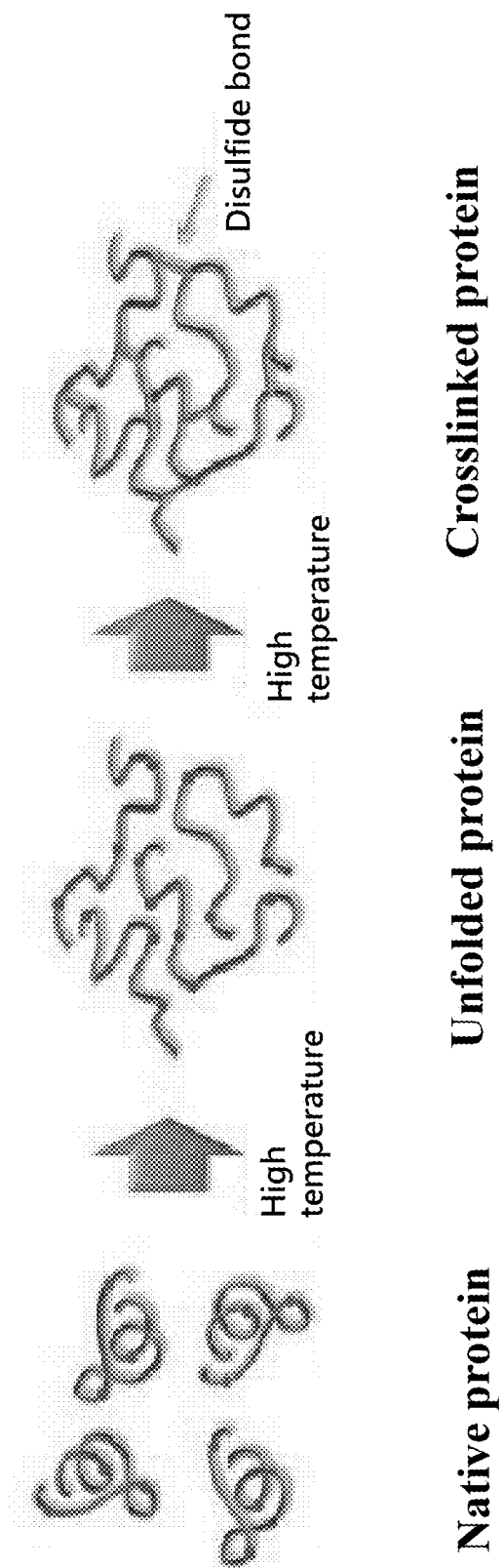
FIG. 1 is a schematic view to illustrate the structural and property change of native protein under denaturing factors.

As shown in FIG. 1, native protein refers to protein existed in the natural environment. After being treated with denaturing factors, such as high temperature or surfactants, the secondary and tertiary structure of the native protein is denatured and unfolded protein is formed. Disulfide bond is formed between cystein in part of the unfolded protein, which forms crosslinked protein. As the structure and characteristic of the unfolded protein and the crosslinked protein are both different from that of the native protein, the unfolded protein and the crosslinked protein may be called "denatured protein."

The invention provides a field-effect transistor and is of the fact that the denatured albumen is able to be treated as a dielectric layer. As such, the dielectric characteristic of the field-effect transistor is good and the field-effect transistor performs well in electric behavior.

Figure 2:
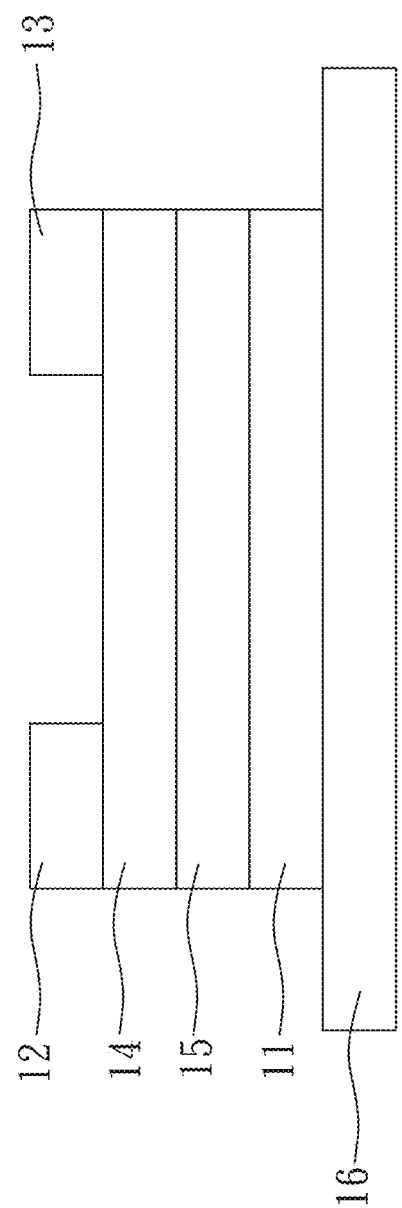
FIG. 2 is a side view to show a first embodiment according to the invention.

With reference to FIG. 2, a first embodiment according to the invention is a bottom-gate, top-contact field-effect transistor and includes a gate electrode (11), a source electrode (12), a drain electrode (13), a semiconductor active layer (14) which is connected to the source electrode (12) and the drain electrode (13), and a dielectric layer (15) which includes denatured albumen and is positioned between the gate electrode (11) and the semiconductor active layer (14).

In this embodiment, the gate electrode (11) and the dielectric layer (15) are positioned on the bottom of the source electrode (12), the drain electrode (13), and the semiconductor active layer (14), and the semiconductor active layer (14) is positioned between the source electrode (12), the drain electrode (13), and the dielectric layer (15) so that the bottom-gate, top-contact field-effect transistor is formed.

In this embodiment, the field-effect transistor further comprises a substrate (16) which is positioned on the bottom of the gate electrode (11). As the subsequent requirement, when the field-effect transistor is designed to be an inflexible electric device, the substrate (16) is a solid substrate, such as but not limited to a glass or a silicon substrate; when the field-effect transistor is designed to be a flexible electric device, the substrate (16) is a soft substrate, such as but not limited to a polyethylene naphthalate (PEN) substrate.

In this embodiment, the semiconductor active layer (14) includes, but not limited to, a metal semiconductor, a metal oxide semiconductor, or an organic semiconductor. Preferably, the semiconductor active layer (14) includes pentacene or carbon-60.

In this embodiment, the denatured albumen of the dielectric layer (15) is originated from avian native egg protein. The denatured albumen is obtained through a heating process, and preferably, the temperature of the heating process ranges from 80 to 200° C.

Specifically, in this embodiment, the native egg protein is coated on the bottom of the semiconductor active layer (14) or on the top of the gate electrode (11), and then heated to convert into the denatured albumen.

It is noted that the denatured albumen is hydrophobic and the hydrophobicity, water contact angle, and surface flatness of the denatured albumen may be varied as the temperature and time of the heating process. The water contact angle of the denatured albumen after being heated up to 160° C. is from 60 to 80 degrees, and the water contact angle of the denatured albumen after being heated up to 100° C. is from 40 to 60 degrees. As such, the 160° C.-heated denatured albumen is more hydrophobic.

Figure 3:
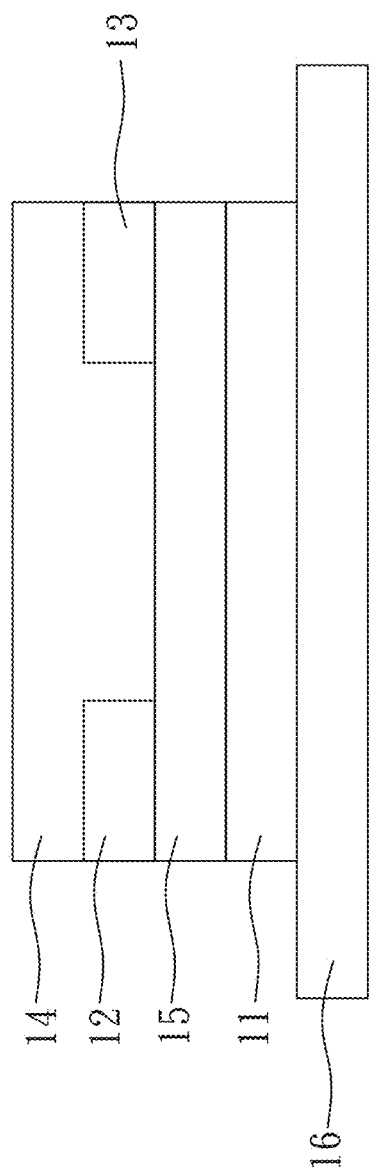
FIG. 3 is a side view to show a second embodiment according to the invention.

Referring to FIG. 3, a second embodiment according to the invention is a bottom-gate, bottom-contact field-effect transistor and includes a gate electrode (11), a source electrode (12), a drain electrode (13), a semiconductor active layer (14) which is connected to the source electrode (12) and the drain electrode (13), and a dielectric layer (15) which includes denatured albumen and is positioned between the gate electrode (11) and the semiconductor active layer (14).

In this embodiment, the gate electrode (11) and the dielectric layer (15) are positioned on the bottom of the source electrode (12), the drain electrode (13), and the semiconductor active layer (14), and the semiconductor active layer (14) covers the top of the source electrode (12), the drain electrode (13), and the dielectric layer (15) so that the bottom-gate, bottom-contact field-effect transistor is formed.

In this embodiment, the field-effect transistor further comprises a substrate (16) which is positioned on the bottom of the gate electrode (11). As the subsequent requirement, when the field-effect transistor is designed to be an inflexible electric device, the substrate (16) is a solid substrate, such as, but not limited to, a glass or a silicon substrate; when the field-effect transistor is designed to be a flexible electric device, the substrate (16) is a soft substrate, such as, but not limited to, a PEN substrate.

In this embodiment, the semiconductor active layer (14) includes, but not limited to, a metal semiconductor, a metal oxide semiconductor, or an organic semiconductor. Preferably, the semiconductor active layer (14) includes pentacene or carbon-60.

In this embodiment, the denatured albumen of the dielectric layer (15) is originated from avian native egg protein. The denatured albumen is obtained through a heating process, and preferably, the temperature of the heating process ranges from 80 to 200° C.

Specifically, in this embodiment, the native egg protein is coated on the bottom of the source electrode (12), the drain electrode (13), and the semiconductor active layer (14), or on the top of the gate electrode (11), and then heated to convert into the denatured albumen.

It is noted that the denatured albumen is hydrophobic and the hydrophobicity, water contact angle, and surface flatness of the denatured albumen may be varied according to differences of the temperature and time of the heating process. The water contact angle of the denatured albumen after being heated up to 160° C. is from 60 to 80 degrees, and that of 100° C.-heated one is from 40 to 60 degrees. As such, the 160° C.-heated denatured albumen is more hydrophobic.

Figure 4:
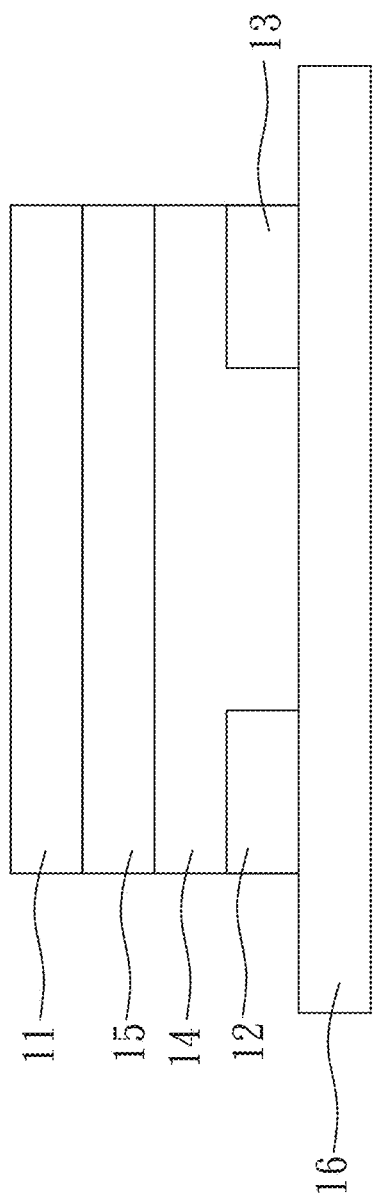
FIG. 4 is a side view to show a third embodiment according to the invention.

Referring to FIG. 4, a third embodiment according to the invention is a top-gate, bottom-contact field-effect transistor and includes a gate electrode (11), a source electrode (12), a drain electrode (13), a semiconductor active layer (14) which is connected to the source electrode (12) and the drain electrode (13), and a dielectric layer (15) which includes denatured albumen and is positioned between the gate electrode (11) and the semiconductor active layer (14).

In this embodiment, the gate electrode (11) and the dielectric layer (15) are positioned on the top of the source electrode (12), the drain electrode (13), and the semiconductor active layer (14), and the semiconductor active layer (14) covers the top of the source electrode (12) and the drain electrode (13) so that the top-gate, bottom-contact field-effect transistor is formed.

In this embodiment, the field-effect transistor further comprises a substrate (16) which is positioned on the bottom of the source electrode (12), the drain electrode (13), and the semiconductor active layer (14). As the subsequent requirement, when the field-effect transistor is readied to be an inflexible electric device, the substrate (16) is a solid substrate, such as but not limited to a glass or a silicon substrate; when the field-effect transistor is readied to be a flexible electric device, the substrate (16) is a soft substrate, such as but not limited to a PEN substrate.

In this embodiment, the semiconductor active layer (14) includes, but not limited to, a metal semiconductor, a metal oxide semiconductor, or an organic semiconductor. Preferably, the semiconductor active layer (14) includes pentacene or carbon-60.

In this embodiment, the denatured albumen of the dielectric layer (15) is originated from avian native egg protein. The denatured albumen is obtained through a heating process, and preferably, the temperature of the heating process ranges from 80 to 200° C.

Specifically, in this embodiment, the native egg protein is coated on the bottom of the gate electrode (11), or on the top of the semiconductor active layer (14), and then heated to convert into the denatured albumen.

It is noted that the denatured albumen is hydrophobic and the hydrophobicity, water contact angle, and surface flatness of the denatured albumen may be responsively varied according to the differences of the temperature and time of the heating process. The water contact angle of 160° C.-heated denatured albumen is from 60 to 80 degrees, and that of 100° C.-heated denatured albumen is from 40 to 60 degrees. As such, the 160° C.-heated denatured albumen is more hydrophobic.

Figure 5:
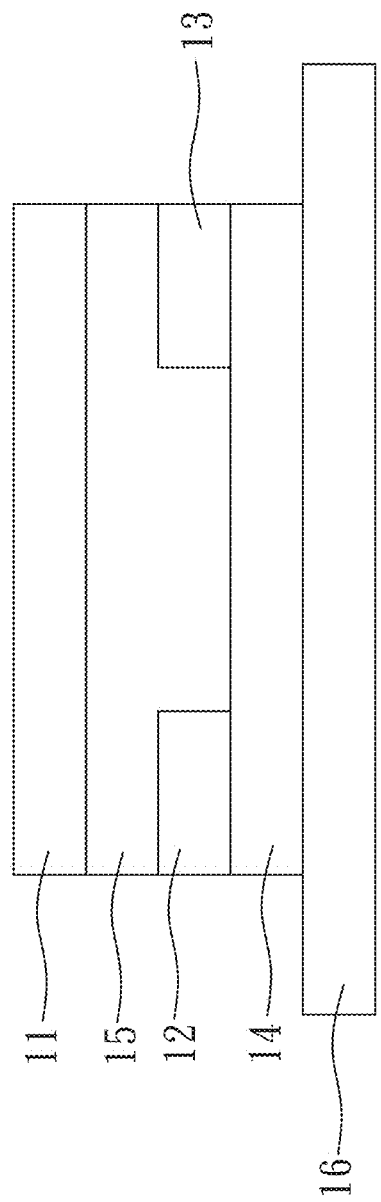
FIG. 5 is a side view to show a forth embodiment according to the invention.

Referring to FIG. 5, a forth embodiment according to the invention is a top-gate, top-contact field-effect transistor and includes a gate electrode (11), a source electrode (12), a drain electrode (13), a semiconductor active layer (14) which is connected to the source electrode (12) and the drain electrode (13), and a dielectric layer (15) which includes denatured albumen and is positioned between the gate electrode (11) and the semiconductor active layer (14).

In this embodiment, the gate electrode (11) and the dielectric layer (15) are positioned on the top of the source electrode (12), the drain electrode (13), and the semiconductor active layer (14), and the semiconductor active layer (14) covers the bottom of the source electrode (12), the drain electrode (13), and the dielectric layer (15) so that the top-gate, top-contact field-effect transistor is formed.

In this embodiment, the field-effect transistor further comprises a substrate (16) which is positioned on the bottom of the semiconductor active layer (14). As the subsequent requirement, when the field-effect transistor is designed to be an inflexible electric device, the substrate (16) is a solid substrate, such as but not limited to a glass or a silicon substrate; and when the field-effect transistor is designed to be a flexible electric device, the substrate (16) is a soft substrate, such as but not limited to a PEN substrate.

In this embodiment, the semiconductor active layer (14) includes, but not limited to, a metal semiconductor, a metal oxide semiconductor, or an organic semiconductor. Preferably, the semiconductor active layer (14) includes pentacene or carbon-60.

In this embodiment, the denatured albumen of the dielectric layer (15) is originated from avian native egg protein. The denatured albumen is obtained through a heating process, and preferably, the temperature of the heating process ranges from 80 to 200° C.

Specifically, in this embodiment, the native egg protein is coated on the bottom of the gate electrode (11), or on the top of the source electrode (12), the drain electrode (13), and the semiconductor active layer (14), and then heated to allow the native egg protein to convert into the denatured albumen.

It is noted that the denatured albumen is hydrophobic and the hydrophobicity, water contact angle, and surface flatness of the denatured albumen may be varied according to the differences of temperature and time of the heating process. The water contact angle of 160° C.-heated denatured albumen is from 60 to 80 degrees, and that of 100° C.-heated one is from 40 to 60 degrees. As such, the 160° C.-heated denatured albumen is more hydrophobic.

As shown in FIGS. 6(A) to 6(D), the output characteristic and the transfer characteristic of an example according to the invention are presented. The example is a bottom-gate, top-contact field-effect transistor in which the denatured albumen of the dielectric layer is obtained through heating to 100° C. for 10 minutes. Then, the denatured albumen of the dielectric layer is heated to 120° C. for 10 minutes, and again to 140° C. for 10 minutes. As a result, it is known that when the semiconductor active layer is pentacene, the example has following parameters: (1) the output current being $-1.6 \times 10^{-6}$ A when the gate voltage is $-25$V; (2) initial voltage being $-8$V; (3) on/off ratio being $10^4$; (4) current leakage being $10^{10}$ A. It is learned that when the semiconductor active layer is carbon-60, the example has the following parameters: (1) output current being $5 \times 10^{-6}$ A when the gate voltage is 25V; (2) initial voltage being 1.5V; (3) on/off ratio being $10^4$; (4) current leakage being $10^{10}$ A. No matter what the semiconductor active layer is, the example still performs well in electric behavior.

Figure 6A:
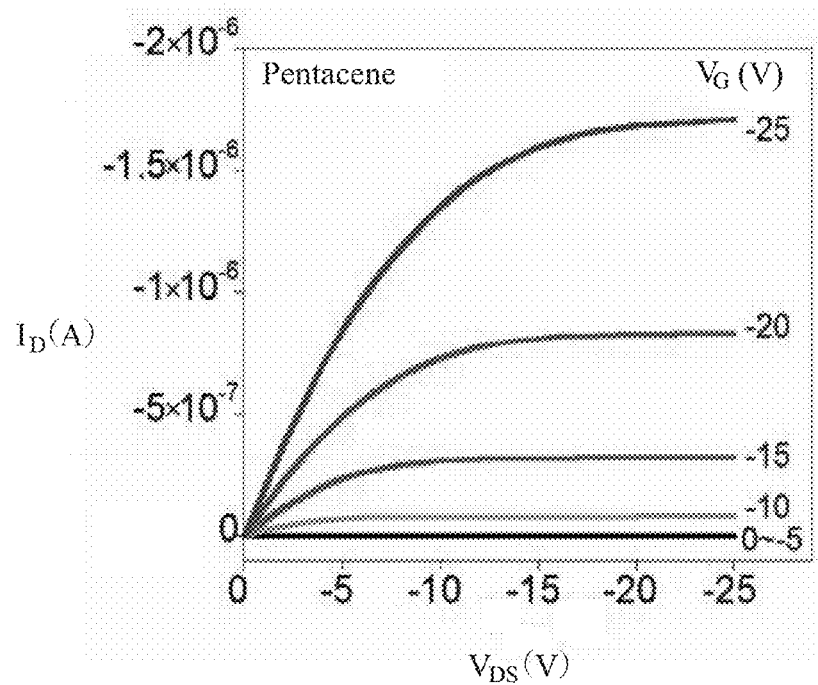
FIGS. 6(A) to 6(D) are diagrams to illustrate the output characteristic and the transfer characteristic of an example according to the invention.
Figure 6B:
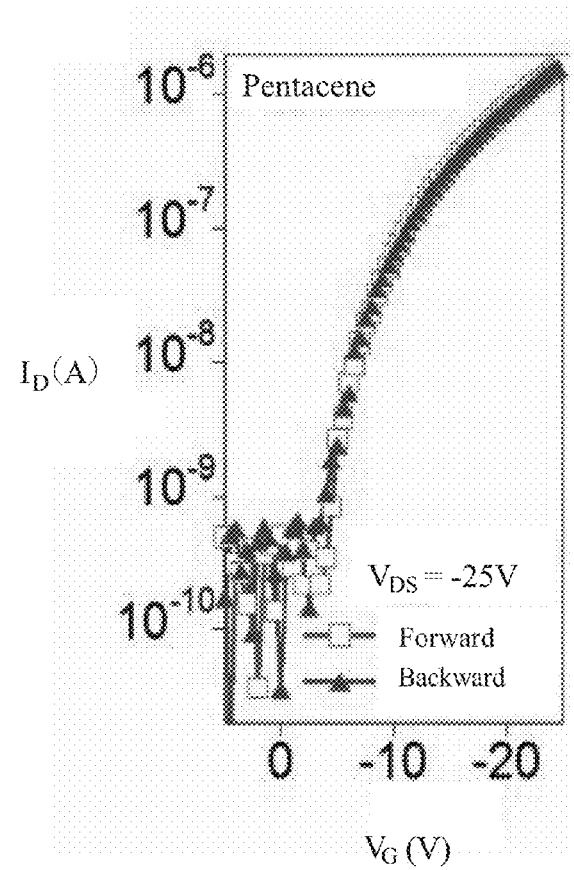
Figure 6C:
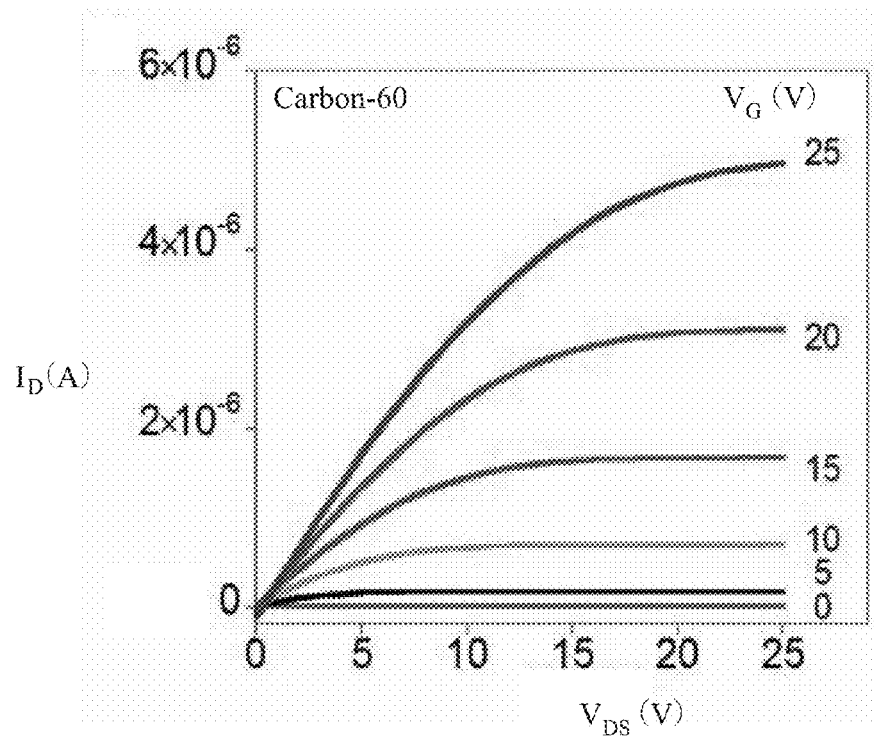
Figure 6D:
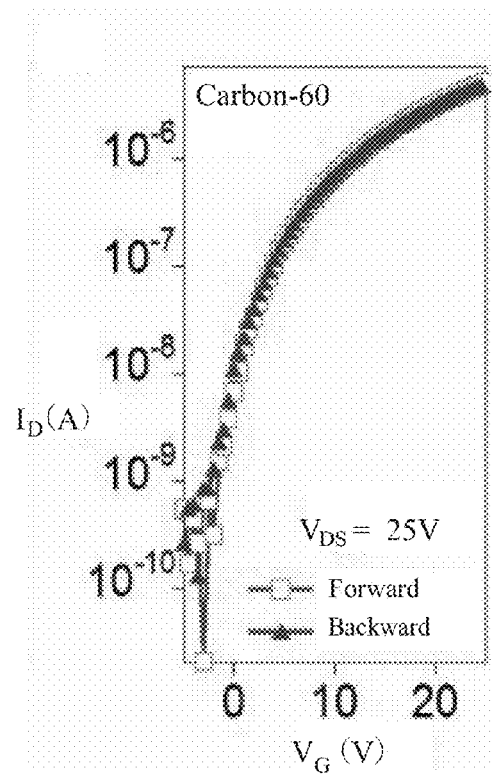

Hysteresis is a challenge involved in the application of a field-effect transistor. As shown in FIGS. 6(B) and 6(D), the example has no hysteresis.

Figure 7:
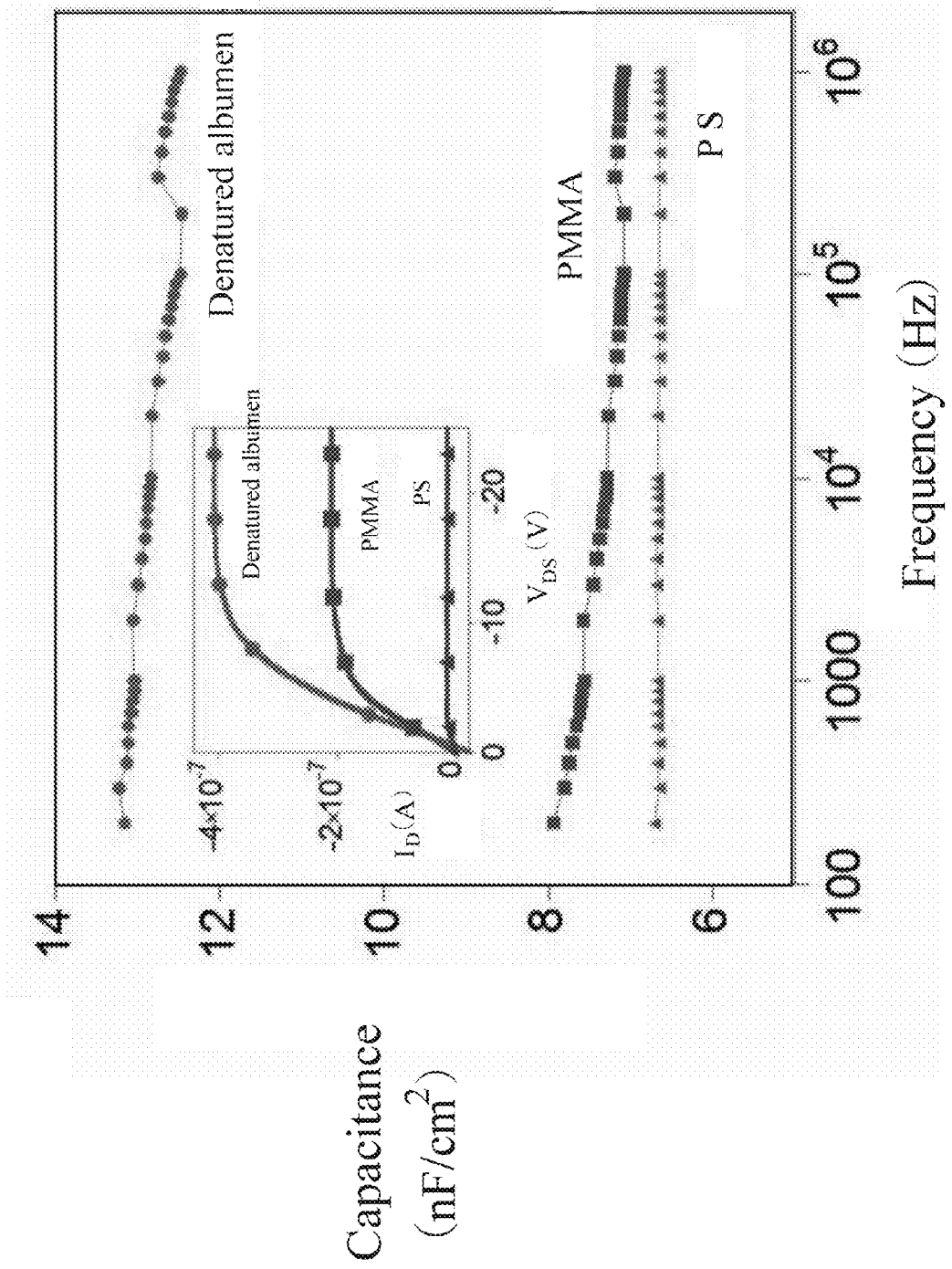
FIG. 7 is a diagram to illustrate the capacitance of denatured albumen with 25V voltage and 200-$10^6$ Hz frequency.

In another aspect, the dielectric constant of a dielectric layer is thought to be related to the output characteristic of a field-effect transistor. For analyzing the dielectric characteristic of denatured albumen, the denatured albumen is purposefully positioned between two metals to form a metal-insulator-metal configuration. As shown in FIG. 7, the capacitance of the denatured albumen with 25V voltage and $200$-$10^6$ Hz frequency is presented. It is noted that the capacitance of the denatured albumen is from 12.45 to 13.25 nF/cm$^2$ as compared to 7.0 to 7.9 nF/cm$^2$ and 6.5 nF/cm$^2$ of the dielectric layer of a prior field-effect transistor, polymethacrylate (PMMA) and polystyrene (PS) respectively. As described above, the dielectric constant of the denatured albumen is twice of that of PMMA or PS. As still shown in FIG. 7, the output characteristic of a field-effect transistor with different dielectric layers is presented. When the denatured albumen is used as the dielectric layer in the field effect transistor, the output current of the field-effect transistor is estimated to be twice of that of PMMA or PS. In summary, denatured albumen indeed shows great dielectric characteristic, and provides a field-effect transistor with good electric behavior.

Figure 8:
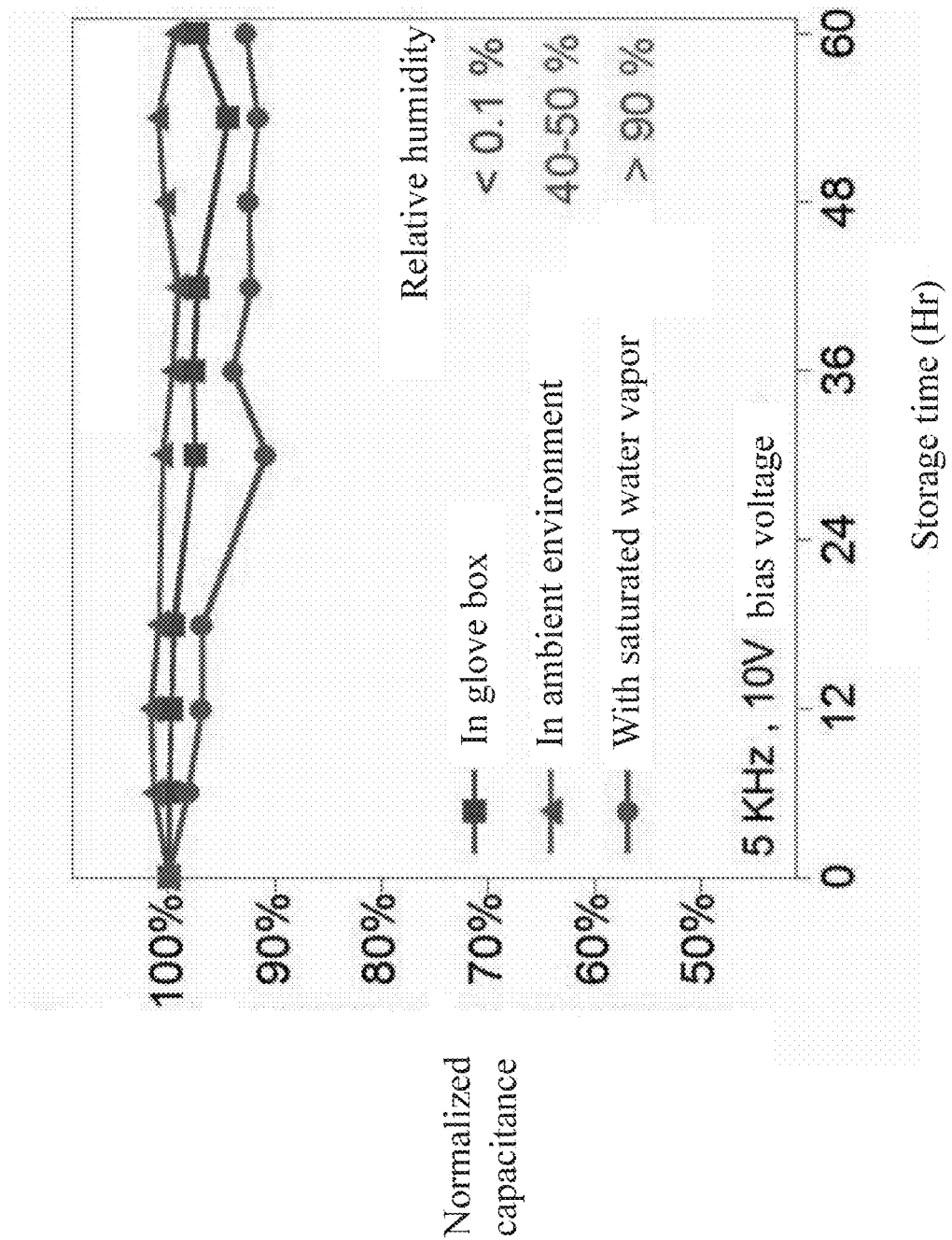
FIG. 8 is a diagram to illustrate the normalized capacitance of denatured albumen in various humidity environments when applied with 10V bias voltage and $5 \times 10^3$ Hz frequency.

In further aspect, the metal-insulator-metal configuration is positioned in different humidity environments for analyzing the capacitance change of the denatured albumen. As shown in FIG. 8, the normalized capacitance of the denatured albumen in various humidity environments when provided with 10V bias voltage and $5 \times 10^3$ Hz frequency is presented. It is learned that the capacitance of the denatured albumen has no obvious change in various humidity environments. As such, the denatured albumen is stable and has a good dielectric characteristic.

Figure 9C:
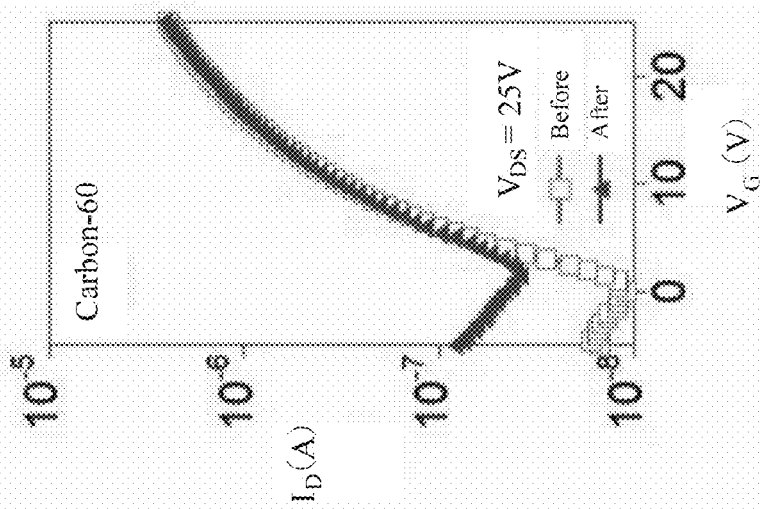
FIGS. 9(B) to 9(C) are diagrams to illustrate the output characteristic of the example in FIG. 9(A) after being bent.
Figure 9B:
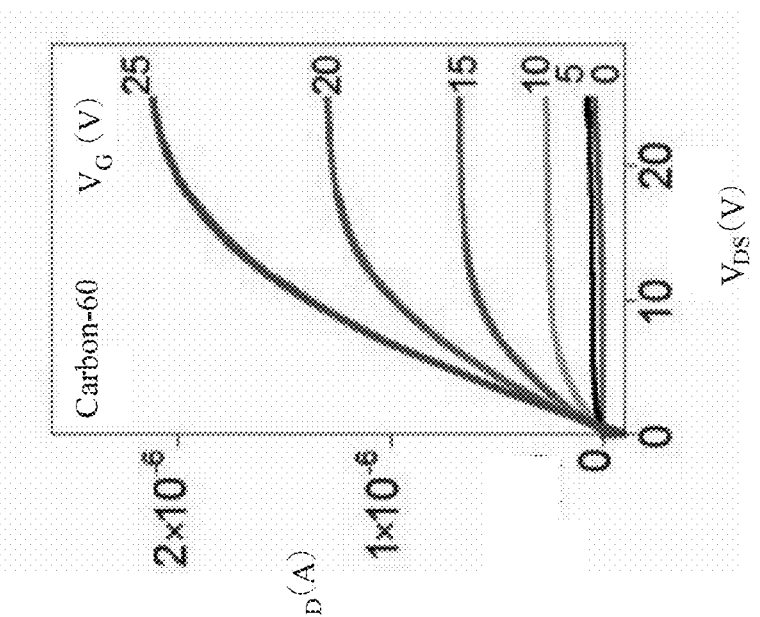
Figure 9A:
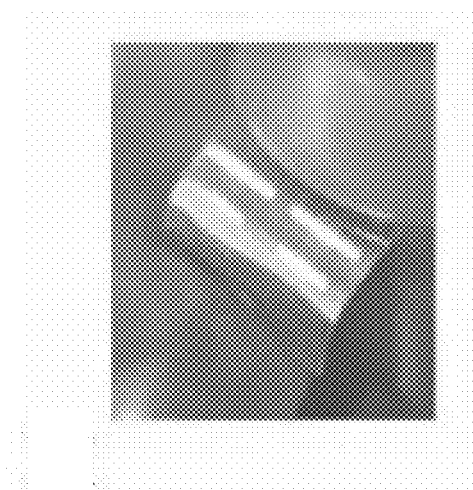
FIG. 9(A) is a picture to show the bending of another example according to the invention.

As shown in FIGS. 9(A) to 9(C), the output characteristic of another example according to the invention after being bent is presented. The example is a bottom-gate, top-contact field-effect transistor in which a PEN substrate is employed.

Referring to FIG. 9(A), the structure made in accordance with the present invention is flexible.

Referring to FIG. 9(B), the example of the field-effect transistor has an output characteristic similar to that of the very first example.

Referring to FIG. 9(C), after being bent to a 0.5-cm radius configuration for multiple times, the output current of the structure of the present invention has no obvious change when compared with that prior to being bent. However, after being bent, the on/off ratio of the structure reduces, which is caused by the increasing current leakage after being bent for multiple times.

In conclusion, the field-effect transistor of the invention employs denatured albumen as its dielectric layer. The denatured albumen has a good dielectric characteristic, so the field-effect transistor of the invention performs well in electric behavior.

While the invention has been described in connection with what is considered the most practical and preferred embodiment, it is understood that this invention is not limited to the disclosed embodiment but is intended to cover various arrangements included within the spirit and scope of the broadest interpretation so as to encompass all such modifications and equivalent arrangements.

What is claimed is:

1. A field-effect transistor, comprising:
   a gate electrode;
   a source electrode;
   a drain electrode;
   a semiconductor active layer connected to the source electrode and the drain electrode; and
   a dielectric layer positioned between the gate electrode and the semiconductor active layer and provided with denatured albumen, wherein the denatured albumen is hydrophobic and formed through a method including heating avian native egg protein at a temperature ranging from 80 to 200° C.

2. The field-effect transistor as claimed in claim 1, wherein the semiconductor active layer is a metal semiconductor, a metal oxide semiconductor, or an organic semiconductor.

3. The field-effect transistor as claimed in claim 1, wherein the semiconductor active layer is pentacene or carbon-60.

4. The field-effect transistor as claimed in claim 1, wherein the gate electrode and the dielectric layer are positioned on bottom of the source electrode, the drain electrode, and the semiconductor active layer, and the semiconductor active layer is positioned between the source electrode, the drain electrode, and the dielectric layer so as to form a bottom-gate, top-contact field-effect transistor.

5. The field-effect transistor as claimed in claim 1, wherein the gate electrode and the dielectric layer are on bottom of the source electrode, the drain electrode, and the semiconductor active layer, and the semiconductor active layer is positioned on top of the source electrode, the drain electrode, and the dielectric layer so as to form a bottom-gate, bottom-contact field-effect transistor.

6. The field-effect transistor as claimed in claim 1, wherein the gate electrode and the dielectric layer are positioned on top of the source electrode, the drain electrode, and the semiconductor active layer, and the semiconductor active layer is on top of the source electrode and the drain electrode so as to form a top-gate, bottom-contact field-effect transistor.

7. The field-effect transistor as claimed in claim 1, wherein the gate electrode and the dielectric layer are positioned on top of the source electrode, the drain electrode, and the semiconductor active layer, and the semiconductor active layer is positioned on bottom of the source electrode, the drain electrode, and the dielectric layer so as to form a top-gate, top-contact field-effect transistor.

* * * * *